(12) United States Patent
Parthasarathy et al.

(10) Patent No.: US 11,676,666 B2
(45) Date of Patent: Jun. 13, 2023

(54) READ DISTURB SCAN FOR UNPROGRAMMED WORDLINES

(71) Applicant: Micron Technology, Inc., Boise, ID (US)

(72) Inventors: Sivagnanam Parthasarathy, Carlsbad, CA (US); Patrick Robert Khayat, San Diego, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/013,419

(22) Filed: Sep. 4, 2020

(65) Prior Publication Data

US 2022/0076757 A1  Mar. 10, 2022

(51) Int. Cl.
*G11C 16/16* (2006.01)
*G11C 16/26* (2006.01)
*G11C 11/56* (2006.01)
*G11C 16/08* (2006.01)

(52) U.S. Cl.
CPC .......... *G11C 16/16* (2013.01); *G11C 11/5635* (2013.01); *G11C 11/5642* (2013.01); *G11C 16/08* (2013.01); *G11C 16/26* (2013.01)

(58) Field of Classification Search
CPC . G11C 16/34; G11C 16/3418; G11C 16/3422; G11C 16/3427; G11C 16/0483
See application file for complete search history.

(56) References Cited

U.S. PATENT DOCUMENTS 9,460,799 B1 * 10/2016 Costa ..................... G11C 29/52
2015/0339188 A1 * 11/2015 Hu .......................... G06F 11/30
                                                                                    714/704
2017/0076811 A1 * 3/2017 Reusswig .............. G11C 29/52

* cited by examiner

*Primary Examiner* — Alfredo Bermudez Lozada
(74) *Attorney, Agent, or Firm* — Greenberg Traurig (57) ABSTRACT

A memory device to perform a read disturb scan of unprogrammed memory cells. In one approach, a test read is performed on unprogrammed memory cells in a first memory block of a storage media (e.g., NAND flash) to provide a test result. Based on the test result, a portion of the unprogrammed cells for which a threshold voltage is above a predetermined voltage is determined. A determination is made whether the portion of the unprogrammed memory cells exceeds a predetermined limit. In response to determining that the portion exceeds the predetermined limit, data is moved from the first memory block to a second memory block of the storage media.

21 Claims, 6 Drawing Sheets

READ DISTURB SCAN FOR UNPROGRAMMED WORDLINES

FIELD OF THE TECHNOLOGY

At least some embodiments disclosed herein relate to memory systems in general, and more particularly, but not limited to memory systems configured to perform a read disturb scan of unprogrammed memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system configured to perform a read disturb scan of unprogrammed memory cells to determine an extent of read disturb. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Conventional approaches used to read programmed memory cells (e.g., reading programmed memory cells in a memory block of a NAND flash memory device) sometimes cause a programming state of nearby unprogrammed memory cells to gradually change over time. This is sometimes, for example, referred to as read disturb. For example, when a memory block has not been fully programmed (sometimes referred to as a partial block or open block), unprogrammed wordlines in the memory block are susceptible to read/program disturb in addition to programmed wordlines. In one example, the read disturb is exhibited by the right tail (e.g., edge 0, E0) of an erased distribution extending increasingly to higher threshold voltages as the extent of read disturb increases.

If the programming state of unprogrammed memory cells significantly changes due to unintended read disturb, then a write-in error may later occur when actually programming the memory cells. In one example, a large number of read disturbs causes the right tail to grow significantly. The impacted wordlines are more likely to exhibit write-in errors when the wordlines are later programmed. A write-in error is an error that is introduced during a program/write operation, and can lead to a threshold voltage that is several levels away from the threshold voltage level that is intended or targeted during programming.

In some cases, when programming a memory cell, a pre-read operation is used as part of a multi-pass programming algorithm. If the memory cell has been subject to read disturb, then the pre-read may mistakenly be determined to be at, for example, a level 1 threshold voltage instead of an expected level 0 threshold voltage. This can cause the next pass of the programming operation to improperly add further charge to the memory cell, which causes the threshold voltage of the memory cell to increase to a level higher than the intended level threshold voltage. This can cause mis-placement errors, increase reliability risks during a read operation, and can limit soft-input error correcting code (ECC) decoding capability.

In one example, two levels (L0 and L1) may be used during the pre-read. For a TLC memory device storing three bits per memory cell, the second programming pass will move level L0 to level L0, L1, L2 or L3, and level L1 will move to level L4, L5, L6, or L7 depending on the next two bits being programmed. If, for example, the memory cell was intended to be programmed to level L0 (data value 1,1,1), and during the pre-read, level L0 was mis-read as level L1, then the programmed value for the memory cell would be data value 0,1,1 corresponding to level L7.

In an attempt to avoid these problems, a flash controller sometimes simply counts the total number of reads to a memory block since a last erase of the block. When the count exceeds a target limit, data stored in the memory block is copied over to a new block. Then, the potentially read disturbed memory block is erased and released to a block pool for future use.

However, existing read disturb management approaches like the above can limit the number of reads allowed for a programmed wordline before folding a memory block in an effort to prevent significant read disturbs. This can cause several problems, including limiting the full potential of read disturbs on programmed wordlines with limited read disturb on unprogrammed wordlines before folding. Also, this can cause the problem of failure to fully scan/protect unprogrammed wordlines to account for variability between memory devices (e.g., processing lots, die, etc.) in terms of their read disturb capability.

In one specific example, a NAND flash memory device erases data in memory blocks. A block is the smallest unit of the memory device that can be erased by the memory device. The NAND flash memory device is programmed/written by pages, and each memory block contains many pages of data. When some pages in a block have been programmed/written and other pages have not been programmed/written, the unprogrammed pages may have shifted from their initial erased state due to read disturb. When the programmed pages are read, read voltages are applied to select the pages for reading. High pass voltages are applied to all other wordlines including unprogrammed wordlines so that these unselected cells are turned on and able to draw current through the bitlines. The high pass voltages can have a negative effect on the unprogrammed pages (e.g., an undesired effect somewhat similar to the effect on memory cells caused by programming pulses used for programmed pages, but much smaller and slower). As a result, the condition of the unprogrammed pages can be disturbed due to these read operations, such that the threshold voltages of the unprogrammed pages shifts from initial or intended values. Since all pages in the block must be erased together, the unprogrammed pages alone cannot be erased to return them to an initial erased condition for programming.

At least some aspects of the present disclosure address the above and other deficiencies by performing a test read of unprogrammed memory cells (e.g., unprogrammed pages in a memory block). The results from the test read are used to determine if the unprogrammed memory cells are disturbed to an extent that creates a risk of failing to reliably write data into the memory cells. Based on evaluation of the results from the test read, unnecessary block folding (based on read count) may be reduced, and/or reliability concerns mitigated. In one example, the test read is used to detect an elevated tail of an erased distribution of unprogrammed wordlines after nearby programmed wordlines have been subject to a large number of read operations. In at least some embodiments described herein, a read disturb scanner performs one or more test reads (e.g., test reads of unprogrammed pages of a memory block of a NAND flash memory) to determine an extent of read disturb (e.g., read disturb for the unprogrammed pages).

In one example, a controller of a NAND flash memory device determines an extent of read disturb by performing a scan to compute a measure of read or edge 0 margin. The controller generates a count of all cells with threshold voltages greater than the applied read voltage. In one example, for evaluation of the read results, an assumption is made that each level for a memory cell is uniformly distributed. This assumption accounts for a binomial distribution around the threshold level to account for scrambler operation. From this evaluation, the controller determines a measure of the read or edge 0 margin. In one example, the evaluation is performed for edge wordlines because the edge wordlines are typically the most susceptible to disturb mechanisms.

In another example, the evaluation is additionally and/or alternatively performed for the unprogrammed wordline(s) adjacent to the last programmed wordline(s). In some cases, for the unprogrammed wordlines, all memory cells will be in an erased state so the evaluation does not need to account for a binomial distribution of data values.

In one example, performing the read disturb scan on the unprogrammed wordlines is triggered based on a read count (e.g., such as a count maintained by conventional read disturb scan algorithms), or by alternative probabilistic read disturb scans. If limited edge 0 (e.g., valley 1) margin is detected, based on the scan, the controller can determine whether to fold the block due to an elevated risk of data loss for the unprogrammed wordlines.

Figure 1:
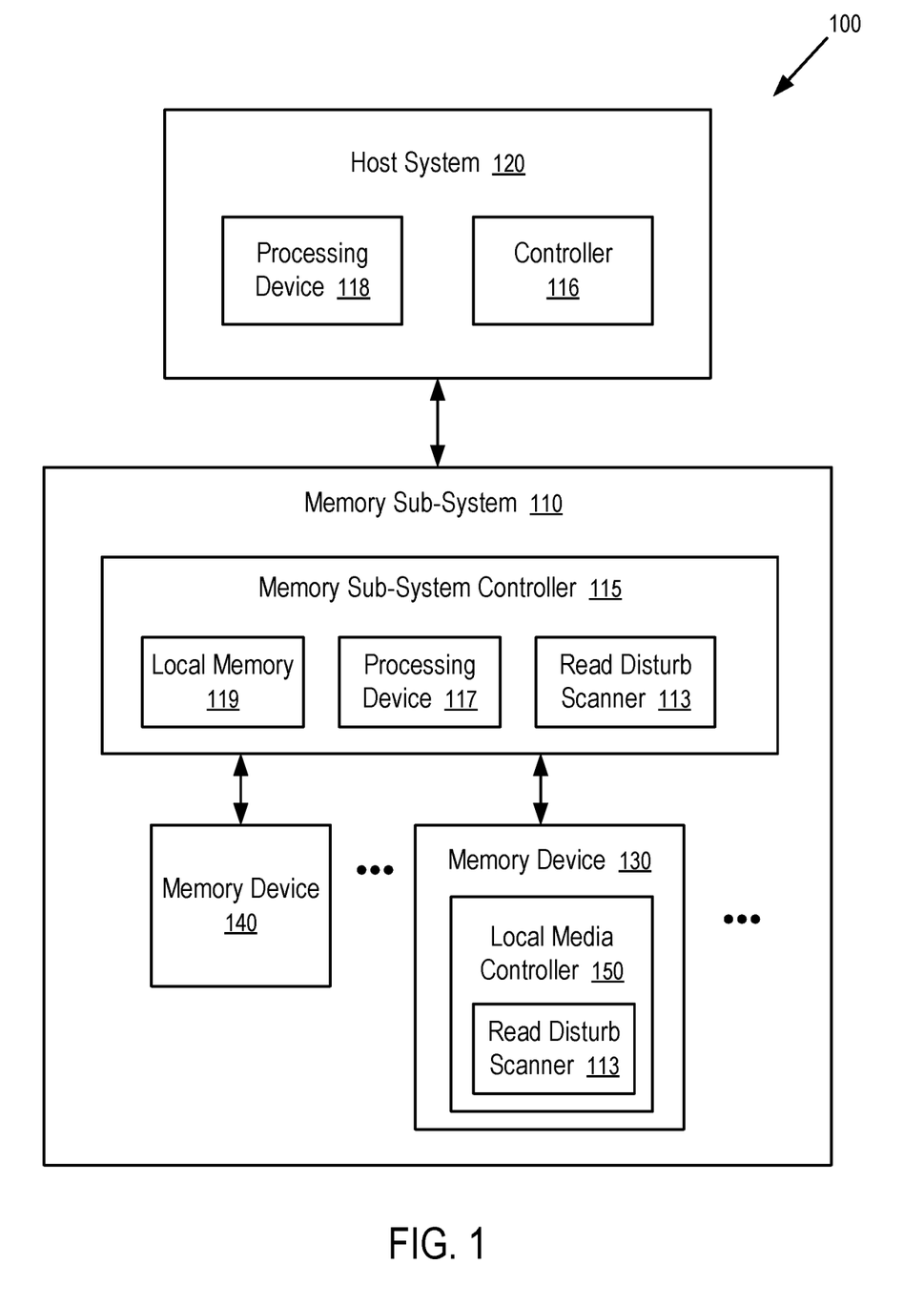
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, am embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read disturb scanner 113 configured to perform a read disturb scan of unprogrammed memory cells (e.g., memory cells in a block of a NAND flash memory device) to determine an extent of read disturb. In some embodiments, the controller 115 in the memory sub-system 110 includes at least a portion of the read disturb scanner 113. In other embodiments, or in combination, the controller 116 and/or the processing device 118 in the host system 120 includes at least a portion of the read disturb scanner 113. For example, the controller 115, the controller 116, and/or the processing device 118 can include logic circuitry implementing the read disturb scanner 113. For example, the controller 115, or the processing device 118 (processor) of the host system 120, can be configured to execute instructions stored in memory for performing the operations of the read disturb scanner 113 described herein. In some embodiments, the read disturb scanner 113 is implemented in an integrated circuit chip disposed in the memory sub-system 110. In other embodiments, the read disturb scanner 113 can be part of firmware of the memory sub-system 110, an operating system of the host system 120, a device driver, or an application, or any combination therein.

For example, the read disturb scanner 113 implemented in the controller 115 can perform a test read on unprogrammed memory cells in a first memory block of memory device 140. Results from the test read are evaluated by controller 115. Based on this evaluation, controller 115 determines a portion (e.g., a number or percentage) of the unprogrammed memory cells for which a threshold voltage is above a predetermined voltage. In one example, the predetermined voltage is an initial threshold voltage for memory cells of the first memory block when the block was erased. In one example, the portion of the unprogrammed memory cells is a number of memory cells for which the threshold voltage is above the initial threshold voltage.

Based on the test read, controller 115 determines an extent of read disturb associated with the first memory block. In one example, the extent of read disturb is based on an extent to which the number of disturbed memory cells exceeds a threshold limit. In one example, the threshold limit is a maximum number of disturbed memory cells for which reliable operation of the first memory block can be achieved. In one example, the threshold limit is a percentage of the memory cells in a memory block.

In one example, the threshold limit is dynamically determined by controller 115 for each memory block of memory device 140 based on evaluating operating characteristics of memory device 140. In one example, the evaluation is based at least in part on data received from one or more sensors of memory device 140 and/or other sensors that provide data associated with the ambient environment of memory device 140. In one example, the sensor is a temperature sensor. In one example, the evaluation is performed by controller 115 using a machine learning model. In one example, the machine learning model is an artificial neural network. In one example, the artificial neural network is trained based on data received from host system 120. In one example, the training data received from host system 120 is based on operating characteristic data received by host system 120 for other memory devices. In one example, the other memory devices include memory device 130, and/or other memory devices of memory sub-system 110 or other systems accessible by host system 120.

In response to determining that the disturbed portion of the unprogrammed memory cells exceeds the threshold limit, controller 115 copies data from the first memory block to a second memory block of memory device 140. In one example, the first memory block is erased after the data is copied, and the first memory block is later used again for writing data as determined by controller 115.

In some cases, controller 115 determines that the extent of read disturb for a memory block is below a threshold limit. In such cases, controller 115 continues to use the memory block for storing data. In one example, controller 115 stores data regarding the extent of read disturb in a table of controller 115. When the memory block is again evaluated for read disturb, the data stored in the table can be used as an input in the evaluation.

Figure 2:
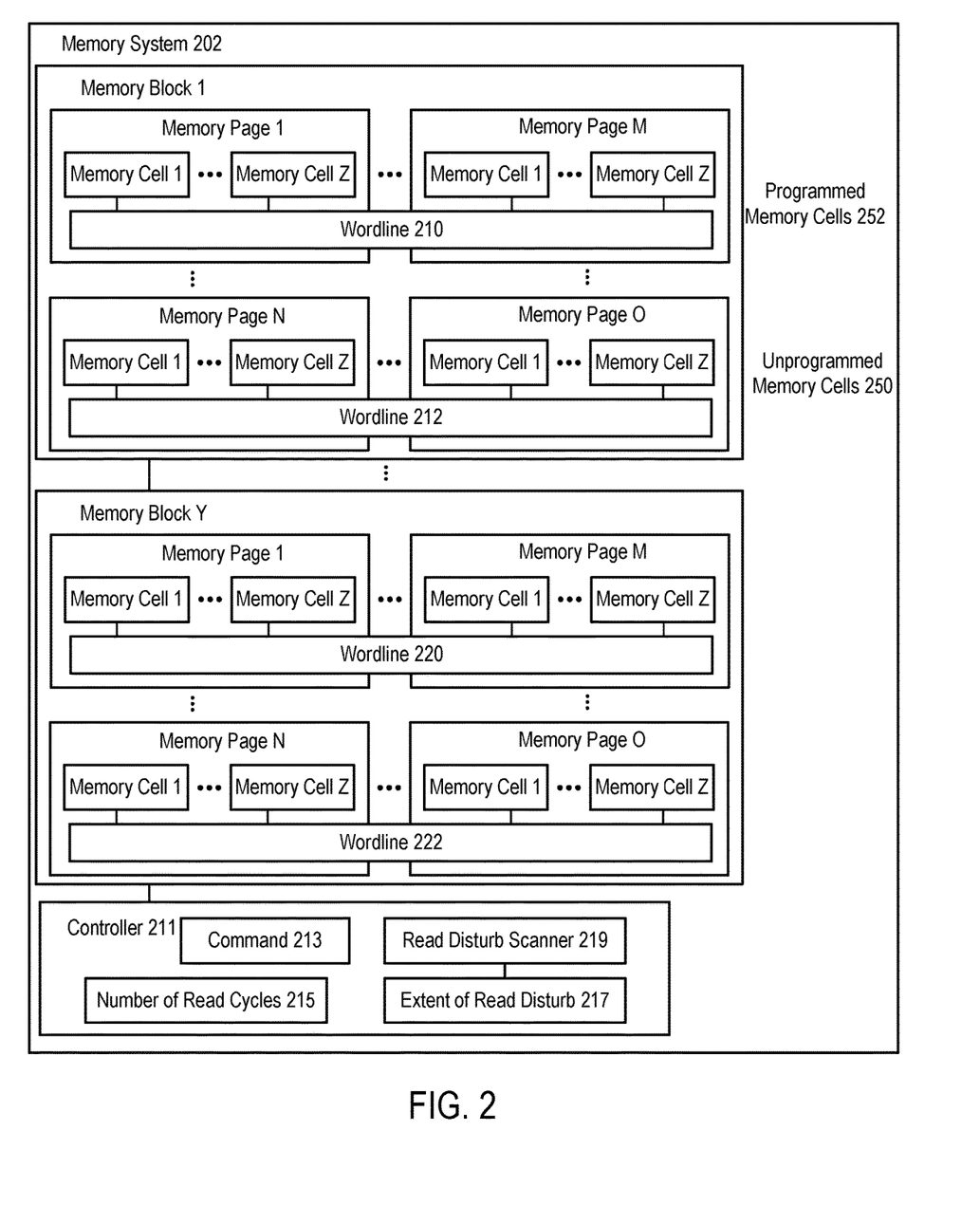
FIG. 2 shows a memory system to perform a read disturb scan of unprogrammed memory cells in a storage media to determine an extent of read disturb, according to one embodiment.

FIG. 2 shows a memory system 202 to perform a read disturb scan of unprogrammed memory cells 250 in a storage media to determine an extent of read disturb, according to one embodiment. Memory system 202 is an example of memory sub-system 110, or memory device 130. The storage media includes various memory blocks 1-Y. Each memory block stores data in memory pages 1-O.

For each memory page, data is stored in memory cells accessed by wordlines. For example, memory pages 1-M of memory block 1 includes sets of memory cells 1-Z, with each set of memory cells in pages 1-M accessed by wordline 210. Memory pages N-O of memory block 1 includes sets of memory cells 1-Z, with each set of memory cells in pages N-O accessed by wordline 212. As another example, memory pages 1-O of memory block Y includes memory cells accessed by wordlines 220-222.

Access to memory blocks 1-Y is controlled by controller 211. Controller 211 is an example of controller 115, or controller 150. In one example, controller 211 receives commands 213 from host system 120, or from controller 115. In one example, commands 213 include read and write commands. In one example, data used by processing device 118 of host system 120 is stored in memory blocks 1-Y.

In one example, memory block 1 has been previously erased. Subsequent to being erased, a portion of memory cells of memory block 1 have been programmed as programmed memory cells 252. Other memory cells of memory block 1 have not yet been programmed, and are indicated in FIG. 2 as unprogrammed memory cells 250. In one example, numerous read commands 213 have been received from a host device, which causes read operations to be performed on programmed memory cells 252 by selectively applying read voltages to the wordlines 210-212 corresponding to the page reads. During these read operations, a portion of unprogrammed memory cells 250 may be affected by read disturb due the pass voltage applied to these wordlines. Pass voltage is also applied to wordlines on programmed memory cells 252 that are not read.

In order to determine an extent of read disturb 217 associated with unprogrammed memory cells 250, controller 211 uses read disturb scanner 219 to perform one or more test reads of unprogrammed memory cells 250 to obtain a test result (e.g., whether each memory cell is conductive when a read voltage is applied to read the memory cell). The test result is evaluated by read disturb scanner 219 to determine the extent of read disturb 217 for unprogrammed memory cells 250. The determined extent of read disturb 217 is stored by the controller 211 for each memory block as test reads may be performed during operation of memory system 202.

In one embodiment, controller 211 maintains data regarding a number of read cycles 215 associated with each memory block. When the number of read cycles 215 reaches a threshold limit (e.g., a limit of 2,000 to 20,000 read cycles), controller 211 initiates a read disturb scan of the respective memory block.

In one embodiment, controller 211 uses an output from an artificial neural network (ANN) (not shown) to determine when to initiate a read disturb scan for a particular memory block. In one example, inputs to the ANN include performance characteristics observed for the particular memory block in prior read operations. In one example, the inputs include an error rate associated with reading data from programmed memory cells 252 and/or prior test reads performed for unprogrammed memory cells 250. In one example, an error correcting code (ECC) decoder provides the error rate associated with reading data from programmed memory cells 252. In one example, the error rate is based on a number of bits corrected in data read from a memory block by the error correcting code.

In one example, the extent of read disturb 217 determined by controller 211 for memory block 1 is compared to a threshold limit. If the extent of read disturb 217 exceeds the limit, controller 211 moves data stored in the memory block 1 to another memory block, such as memory block Y.

In one embodiment, only a portion of unprogrammed memory cells 250 are selected for performing a test read. In one example, the selected portion corresponds to those memory cells accessed by one or more wordlines that are in closer proximity to wordlines used to read programmed memory cells 252. In one example, controller 211 selects the one or more wordlines for performing test reads based on this proximity.

In one example, wordline 212 is selected for performing the test read because wordline 212 is adjacent to wordline 210, (e.g., the last programmed wordline). In one example, wordline 212 is immediately adjacent (e.g., there are no intervening wordlines) to wordline 210. In one example, wordline 212 is less than 2-10 wordlines away from wordline 210.

In one example, wordline 222 is selected for performing the test read because wordline 222 is located at an edge of the physical memory array that includes memory block 1. In one example, wordline 222 is the outermost wordline of the memory array. In one example, wordline 220 is within 3,000 nanometers of the edge of the memory array. In one example, wordlines that are more susceptible to read disturb are known and are selected for test reading. In one example, respective scores or values that indicate susceptibility to read disturb can be stored in a table in memory for each wordline, set of wordlines, memory block, and/or range of memory blocks. The scores or values may be based on prior performance, operating context, or other data collected by controller 211 and used to generate the score or value (e.g., using an artificial neural network, such as ANN 322 below). The scores or values can be used to select wordlines to use for test reading.

Figure 3:
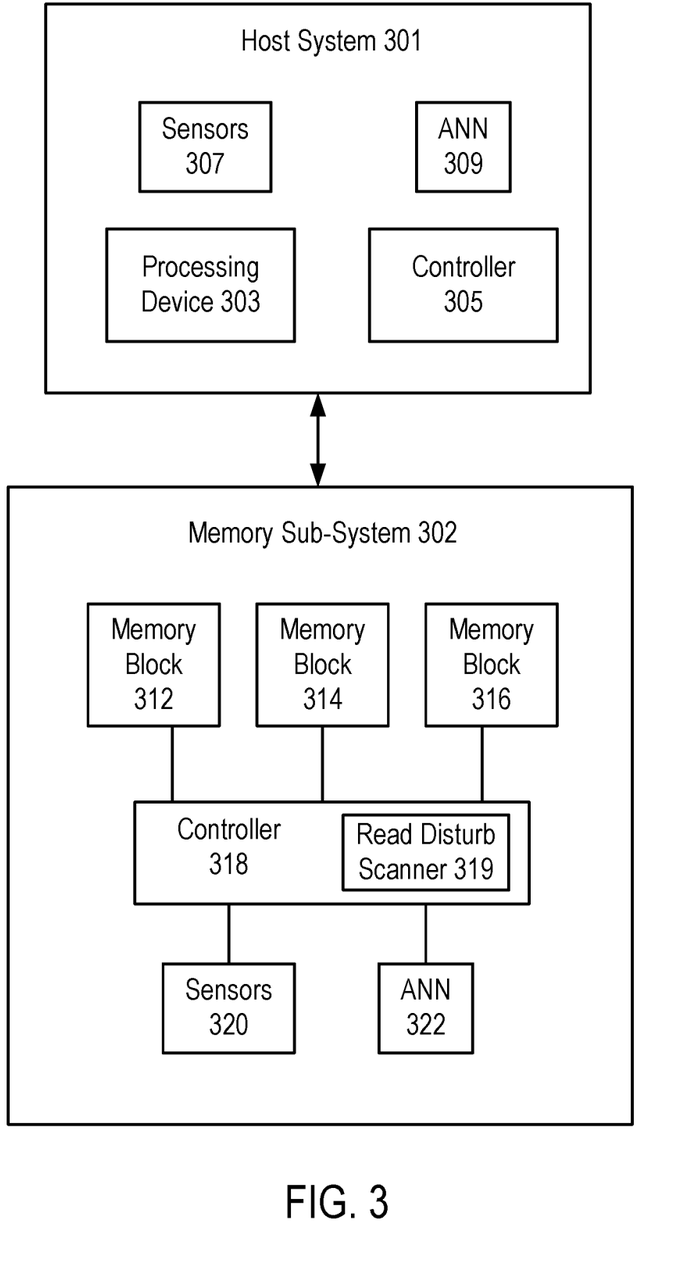
FIG. 3 shows a memory sub-system having a controller that performs a read disturb scan based on data collected by one or more sensors, and/or an output from an artificial neural network, according to one embodiment.

FIG. 3 shows a memory sub-system 302 having a controller 318 that performs a read disturb scan based on data collected by one or more sensors 320, and/or an output from an artificial neural network (ANN) 322, according to one embodiment. Memory sub-system 302 is an example of memory sub-system 110. Controller 318 is an example of controller 115.

Host system 301 stores data in memory sub-system 302. Controller 305 of host system 301 sends commands to controller 318 to read or write data in memory blocks 312, 314, 316. Host system 301 is an example of host system 120. Controller 305 is an example of controller 116. Controller 318 executes read disturb scanner 319 to perform test reads of one or more of memory blocks 312, 314, 316. Read disturb scanner 319 is an example of read disturb scanner 113.

In one embodiment, controller 318 determines one or more operating characteristics of a memory device that includes memory blocks 312, 314, 316. In one example, the memory device is a NAND flash memory device. In one example, the memory device is memory device 130 or 140.

In one embodiment, the operating characteristics may include sensor data received from one or more sensors 320, and/or a count of the number of program/erase cycles. In one example, the operating characteristics include temperature data collected by sensors 320 for the memory device.

Controller 318 evaluates the operating characteristics to provide an evaluation result that indicates an estimated extent of read disturb for one or more of memory blocks 312, 314, 316. In one example, the estimated extent of read disturb is based on physical characterization data associated with memory blocks of other memory devices that are physically similar in structure to memory blocks 312, 314, and/or 316.

In one embodiment, the evaluation of the operating characteristics is based on an output from ANN 322, and the operating characteristics are an input to ANN 322. In one example, the input to ANN 322 includes temperature data collected for memory block 312, a time that has elapsed since a memory block was last erased, a number of program/erase cycles, and/or a number of read cycles for a memory block.

Controller 318 compares the evaluation result to a predetermined threshold. Based on this comparison, controller 318 determines whether to initiate a test read of a memory block using read disturb scanner 319. In one example, the evaluation result is a score determined by ANN 322. If the score exceeds a threshold limit, controller 318 performs one or more test reads of corresponding memory blocks 312, 314, 316.

In one embodiment, host system 301 includes processing device 303 to collect data for use in determining when to perform a test read of a memory block. In one example, processing device uses data from sensors 307 and/or an output from ANN 309 to determine whether to perform a test read. In one example, sensors 307 collect data regarding operating characteristics of memory sub-systems other than system 302. In one example, sensor data from sensors 307 is an input to ANN 309. In one example, processing device 303 sends a signal to controller 318 indicating that a particular memory block is to be tested for read disturb. In response to receiving the signal, controller 318 executes read disturb scanner 319 for the identified memory block.

In one example, in response to determining that memory block 312 exhibits or is suspected of having excessive read disturb, controller 318 copies data from memory block 312 to memory block 314. Controller 318 stores data (e.g., in a table in memory) indicating that memory block 312 is to be erased prior to any further use for storing data.

Figure 4:
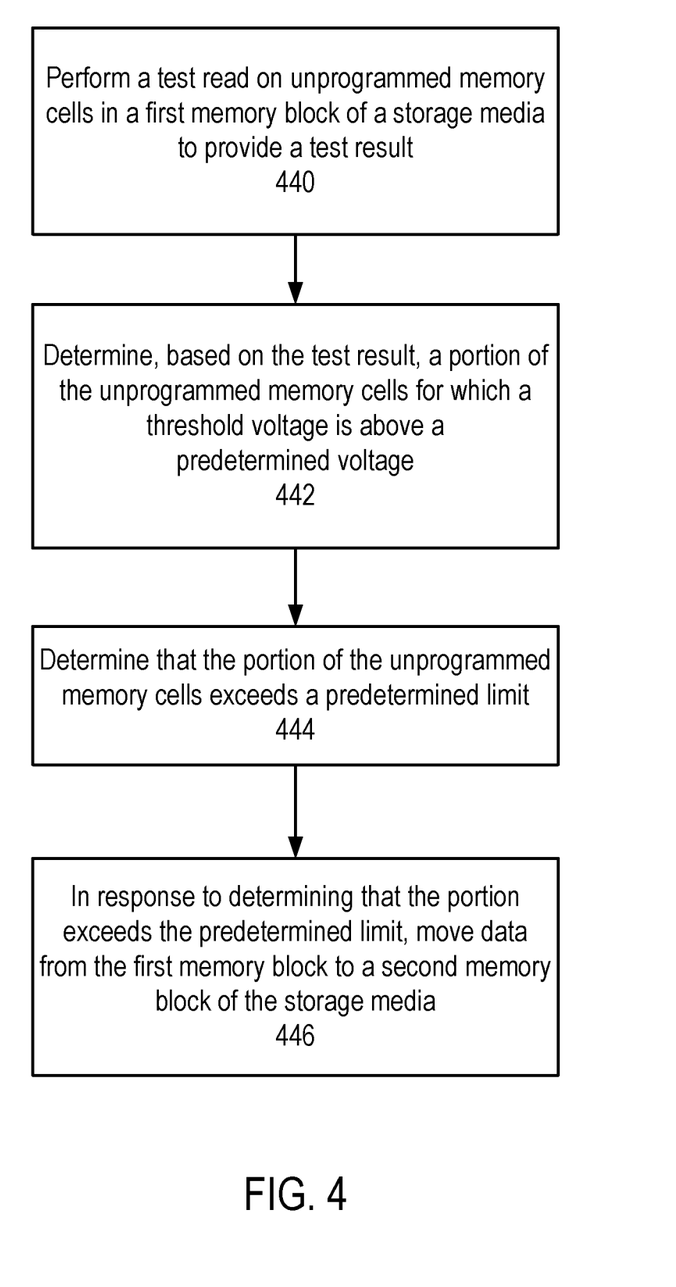
FIG. 4 shows a method to perform a read disturb scan of unprogrammed memory cells to determine an extent of read disturb, according to one embodiment.

FIG. 4 shows a method to perform a read disturb scan of unprogrammed memory cells to determine an extent of read disturb, according to one embodiment. The method of FIG. 4 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 4 is performed at least in part by the controller 115 of FIG. 1, the controller 211 of FIG. 2, or the controller 318 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 4 can be implemented in a computing system of FIG. 1 with controller 211 executing read disturb scanner 219, or controller 318 executing read disturb scanner 319, as illustrated in FIGS. 2-3.

At block 440, a test read is performed on unprogrammed memory cells in a first memory block of a storage media to provide a test result. In one example, read disturb scanner 219 is used to perform a test read of unprogrammed memory cells 250.

At block 442, based on the test result, a determination is made of a portion of the unprogrammed memory cells for which a threshold voltage is above a predetermined voltage. In one example, controller 211 identifies a number of unprogrammed memory cells 250 that have a threshold voltage above a desired target threshold voltage, or above an initial threshold voltage following a prior erase of memory block 1.

At block 444, a determination is made that the portion of the unprogrammed memory cells exceeds a predetermined limit. In one example, controller 211 determines that the number of disturbed memory cells 250 exceeds a threshold number.

At block 446, in response to determining that the portion exceeds the predetermined limit, data is moved from the first memory block to a second memory block of the storage media. In one example, data from memory block 1 is copied to memory block Y.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 5:
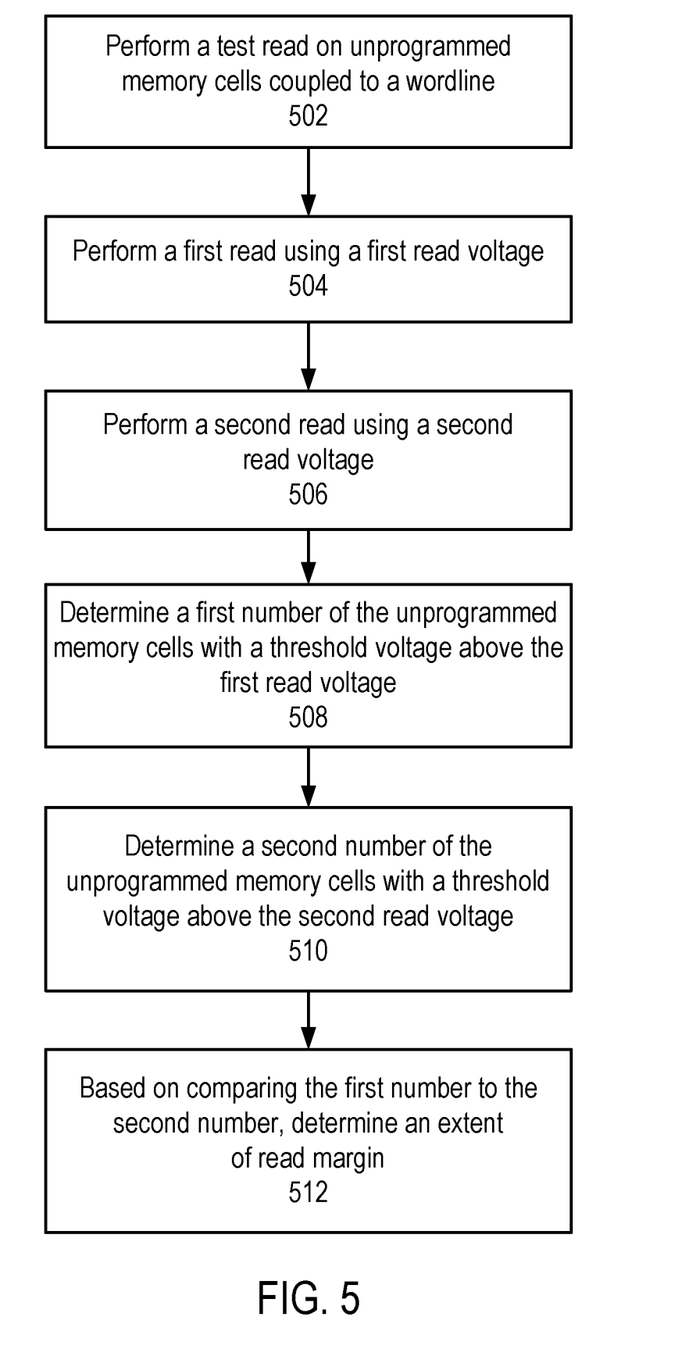
FIG. 5 shows a method to determine an extent of read margin by performing multiple reads of unprogrammed memory cells, according to one embodiment.

FIG. 5 shows a method to determine an extent of read margin by performing multiple reads of unprogrammed memory cells, according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, the controller 211 of FIG. 2, or the controller 318 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with controller 211 executing read disturb scanner 219, or controller 318 executing read disturb scanner 319, as illustrated in FIGS. 2-3.

At block 502, a test read is performed on unprogrammed memory cells (e.g., the cells coupled to a wordline). In one example, controller 318 performs a test read of unprogrammed memory cells in memory block 312.

At block 504, a first read is performed using a first read voltage. In one example, the test read is performed using multiple reads, each read having a corresponding read voltage. In one example, the multiple reads are used to characterize an extent of read disturb. In one example, the multiple reads are used to characterize the right tail of an erased distribution for memory cells in memory block 312.

At block 506, a second read is performed using a second read voltage. In one example, the second read voltage is greater than the first read voltage. In one example, the second read voltage is selected by controller 211 based on a result determined from performing the first read.

At block 508, a determination is made of a first number of the unprogrammed memory cells with a threshold voltage above the first read voltage. In one example, the first read voltage corresponds to a target voltage used in multi-pass programming of memory cells.

At block 510, a determination is made of a second number of the unprogrammed memory cells with a threshold voltage above the second read voltage.

At block 512, based on comparing the first number to the second number, an extent of read margin is determined. In one example, based on this comparison, controller 211 determines the extent of read disturb 217 for memory block 1 of FIG. 2.

In one example, the multiple reads above are performed to take multiple measurements of a population of memory cells to estimate the shape of the level 0 (L0) (erased distribution) tail. The first measurement is performed at a preferred L0 read voltage, and a first number of unprogrammed memory cells outside of an expected unprogrammed voltage range is determined.

The second measurement is performed by moving the read voltage further outside the expected unprogrammed voltage range. A second number of the memory cells outside of the unprogrammed voltage range is counted. The first number and the second number are compared to evaluate the extent of read disturb for a memory block.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 6:
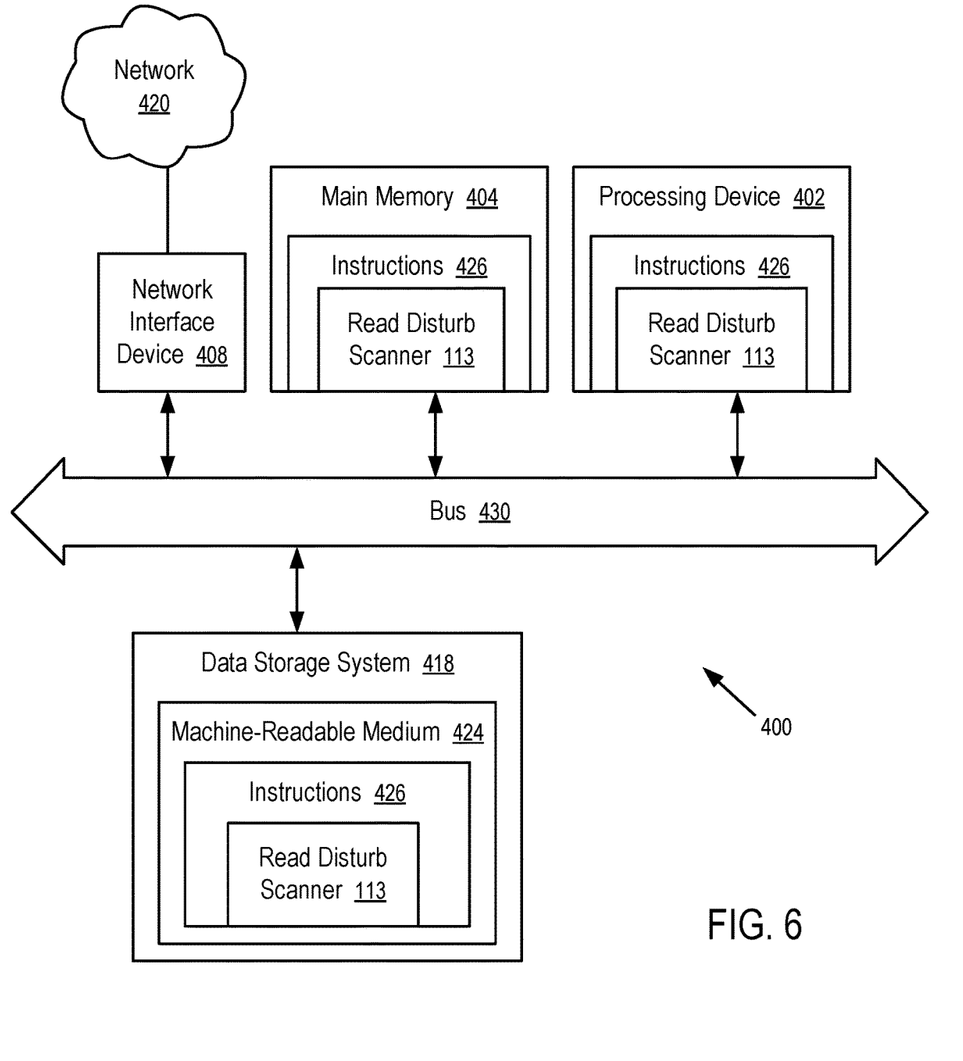
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read disturb scanner 113 (e.g., to execute instructions to perform operations corresponding to the read disturb scanner 113, 219, 319 described with reference to FIGS. 1-3). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read disturb scanner 113 (e.g., the read disturb scanner 113, 219, 319 described with reference to FIGS. 1-3). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

In one embodiment, a system includes: a storage media including memory blocks (e.g., memory blocks 1-Y) for storing data; and at least one controller (e.g., controller 211) configured to: perform a test read on unprogrammed memory cells (e.g., 250) in a first memory block (e.g., memory block 1) of the storage media to provide a test result; determine, based on the test result, a portion of the unprogrammed memory cells for which a threshold voltage is above a predetermined voltage; determine that the portion of the unprogrammed memory cells exceeds a predetermined limit; and in response to determining that the portion exceeds the predetermined limit, move data from the first memory block to a second memory block (e.g., memory block Y) of the storage media.

In one embodiment, the first memory block includes a first wordline (e.g., 212), and a second wordline (e.g., 220) that is adjacent to the first wordline. Programmed memory cells (e.g., 252) in the first memory block are configured for selection using the first wordline. The unprogrammed memory cells are configured for selection using the second wordline.

In one embodiment, the memory blocks for storing data are part of a memory array having a plurality of wordlines configured for accessing memory cells of the memory array. The second wordline (e.g., 222) is located at an edge of the memory array.

In one embodiment, the second wordline is configured for selection (e.g., by controller 211) based on being identified as a wordline that is less tolerant of read disturb than the first wordline, and/or less tolerant than one or more other wordlines. In one example, a wordline is identified as less tolerant based on having a characteristic or score associated with the wordline that is compared to a fixed or threshold value. In one example, the wordline is identified based on an output from ANN 322.

In one embodiment, the first memory block comprises a first wordline. Programmed memory cells in the first memory block are configured for selection using the first wordline. The at least one controller is further configured to select a second wordline based on a susceptibility (e.g., the susceptibility score above, and/or using ANN 322) of the second wordline to read disturb. The unprogrammed memory cells are selected using the second wordline.

In one embodiment, the storage media is part of a memory system, and the at least one controller is further configured to: determine at least one operating characteristic of the memory system; evaluate the at least one operating characteristic to provide an evaluation result that indicates an extent of read disturb for the first memory block; and determine that the evaluation result exceeds a predetermined threshold. The test read is performed in response to determining that the evaluation result exceeds the predetermined threshold In one embodiment, the system further includes at least one sensor, where the at least one operating characteristic includes sensor data received from the at least one sensor.

In one embodiment, evaluating the at least one operating characteristic includes using an output from an artificial neural network (e.g., 322) having the at least one operating characteristic as an input.

In one embodiment, a method includes: performing a test read on unprogrammed memory cells in a first memory block to provide a test result; determining, based on the test result, a portion of the unprogrammed memory cells for which a threshold voltage is above a predetermined voltage; determining that the portion of the unprogrammed memory cells exceeds a predetermined limit; and in response to determining that the portion exceeds the predetermined limit, moving data from the first memory block to a second memory block.

In one embodiment, the first memory block further includes programmed memory cells that store the data. Moving the data includes copying the data from the programmed memory cells in the first memory block, and programming the copied data into memory cells in the second memory block.

In one embodiment, the programmed memory cells in the first memory block are configured for selection using a first wordline. The method further includes identifying a second wordline of the first memory block that is adjacent to the first wordline. The unprogrammed memory cells are configured for selection using the second wordline.

In one embodiment, the method further includes, in response to determining that the portion exceeds the predetermined limit, storing an indication that the first memory block is to be erased prior to being programmed.

In one embodiment, the method further includes: erasing the first memory block; after erasing the first memory block, writing data to the first memory block; reading the written data using a plurality of reads to the first memory block; and counting a number of the reads to the first memory block. The test read is performed in response to the number of reads exceeding a predetermined limit.

In one embodiment, the method further includes: determining at least one operating characteristic for a memory device that includes the first memory block; evaluating the at least one operating characteristic to provide an evaluation result that indicates an extent of read disturb for the first memory block; and determining that the evaluation result exceeds a predetermined threshold. The test read is performed in response to determining that the evaluation result exceeds the predetermined threshold.

In one embodiment, the evaluation result is at least one of: a probability of read disturb, or an output from a machine learning model. In one example, the probability of read disturb is based on memory cell device characterization data accessible by controller 211 (e.g., data stored in a table in memory of a memory device).

In one embodiment, the evaluation result corresponds to an extent of read margin.

In one embodiment, at least one operating characteristic includes at least one of: memory cell charge leakage; a historical rate of read failures associated with the first memory block; a historical rate of read failures associated with memory blocks of the memory device other than the first memory block; or data regarding prior test reads of memory blocks of the memory device other than the first memory block.

In one embodiment, the at least one operating characteristic includes sensor data received from at least one sensor of the memory device; and evaluating the at least one operating characteristic includes using an artificial neural network (ANN) having the sensor data as an input. An output from the ANN provides the evaluation result.

In one embodiment, determining that the evaluation result exceeds the predetermined threshold includes detecting an anomaly that deviates, by the predetermined threshold, from historical data patterns associated with operation of the memory device.

In one embodiment, performing the test read includes: performing a first read using a first read voltage; performing a second read using a second read voltage; and determining a first number of the unprogrammed memory cells with a threshold voltage above the first read voltage, and a second number of the unprogrammed memory cells with a threshold voltage above the second read voltage.

In one embodiment, the method further includes: comparing the first number to the second number; and based on comparing the first number to the second number, determining an extent of read margin.

In one embodiment, a non-transitory computer-readable medium stores instructions which, when executed on at least one processing device, cause the at least one processing device to: perform a test read on unprogrammed memory cells in a first memory block to provide a test result; determine, based on the test result, a portion of the unprogrammed memory cells for which a threshold voltage is above a predetermined voltage; determine that the portion of the unprogrammed memory cells exceeds a predetermined limit; and in response to determining that the portion exceeds the predetermined limit, copy data from the first memory block to a second memory block.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a storage media comprising memory blocks for storing data; and
at least one controller configured to:
perform a test read on unprogrammed memory cells in a first memory block of the storage media to provide a test result;
determine, based on the test result, a portion of the unprogrammed memory cells for which a threshold voltage is above a predetermined voltage;
determine that the portion of the unprogrammed memory cells exceeds a predetermined limit; and
in response to determining that the portion exceeds the predetermined limit, move data from the first memory block to a second memory block of the storage media and store in a register an indication that the first memory block is to be erased prior to being programmed,
wherein the predetermined limit is determined based on an environmental characteristic detected by a sensor disposed in the storage media.

2. The system of claim 1, wherein:
the first memory block comprises a first wordline, and a second wordline that is adjacent to the first wordline;
programmed memory cells in the first memory block are configured for selection using the first wordline; and
the unprogrammed memory cells are configured for selection using the second wordline.

3. The system of claim 2, wherein:
the memory blocks for storing data are part of a memory array having a plurality of wordlines configured for accessing memory cells of the memory array; and
the second wordline is located at an edge of the memory array.

4. The system of claim 1, wherein:
the first memory block comprises a first wordline;
programmed memory cells in the first memory block are configured for selection using the first wordline; and
the at least one controller is further configured to select a second wordline based on a susceptibility of the second wordline to read disturb, wherein the unprogrammed memory cells are selected using the second wordline.

5. The system of claim 1, wherein the storage media is part of a memory system, and the at least one controller is further configured to:
determine at least one operating characteristic of the memory system;
evaluate the at least one operating characteristic to provide an evaluation result that indicates an extent of read disturb for the first memory block; and
determine that the evaluation result exceeds a predetermined threshold;
wherein the test read is performed in response to determining that the evaluation result exceeds the predetermined threshold.

6. The system of claim 5, further comprising at least one sensor, wherein the at least one operating characteristic includes sensor data received from the at least one sensor.

7. The system of claim 5, wherein evaluating the at least one operating characteristic comprises using an output from an artificial neural network having the at least one operating characteristic as an input.

8. A method comprising:
performing a test read on unprogrammed memory cells in a first memory block to provide a test result, the performing the test read comprising:
performing a first read using a first read voltage;
performing a second read using a second read voltage; and
determining a first number of the unprogrammed memory cells with a threshold voltage above the first read voltage, and a second number of the unprogrammed memory cells with a threshold voltage above the second read voltage;
determining, based on the test result, a portion of the unprogrammed memory cells for which a threshold voltage is above a predetermined voltage;
determining that the portion of the unprogrammed memory cells exceeds a predetermined limit; and
in response to determining that the portion exceeds the predetermined limit, moving data from the first memory block to a second memory block and storing an indication that the first memory block is to be erased prior to being programmed.

9. The method of claim 8, wherein:
the first memory block further includes programmed memory cells that store the data;
moving the data comprises copying the data from the programmed memory cells in the first memory block, and programming the copied data into memory cells in the second memory block;
the programmed memory cells in the first memory block are configured for selection using a first wordline; and
the method further comprises identifying a second wordline of the first memory block that is adjacent to the first wordline, wherein the unprogrammed memory cells are configured for selection using the second wordline.

10. The method of claim 8, further comprising:
erasing the first memory block;
after erasing the first memory block, writing data to the first memory block;
reading the written data using a plurality of reads to the first memory block; and
counting a number of the reads to the first memory block;
wherein the test read is performed in response to the number of reads exceeding a predetermined limit.

11. The method of claim 8, further comprising:
determining at least one operating characteristic for a memory device that includes the first memory block;
evaluating the at least one operating characteristic to provide an evaluation result that indicates an extent of read disturb for the first memory block; and
determining that the evaluation result exceeds a predetermined threshold;
wherein the test read is performed in response to determining that the evaluation result exceeds the predetermined threshold.

12. The method of claim 11, wherein the evaluation result is at least one of a probability of read disturb, or an output from a machine learning model.

13. The method of claim 11, wherein the evaluation result corresponds to an extent of read margin.

14. The method of claim 11, wherein the at least one operating characteristic includes at least one of:
memory cell charge leakage;
a historical rate of read failures associated with the first memory block;
a historical rate of read failures associated with memory blocks of the memory device other than the first memory block; or
data regarding prior test reads of memory blocks of the memory device other than the first memory block.

15. The method of claim 11, wherein:
the at least one operating characteristic includes sensor data received from at least one sensor of the memory device; and
evaluating the at least one operating characteristic comprises using an artificial neural network (ANN) having the sensor data as an input, wherein an output from the ANN provides the evaluation result.

16. The method of claim 11, wherein determining that the evaluation result exceeds the predetermined threshold comprises detecting an anomaly that deviates, by the predetermined threshold, from historical data patterns associated with operation of the memory device.

17. The method of claim 8, further comprising:
comparing the first number to the second number; and
based on comparing the first number to the second number, determining an extent of read margin.

18. A non-transitory computer-readable medium storing instructions which, when executed on at least one processing device, cause the at least one processing device to:
perform a test read on unprogrammed memory cells in a first memory block to provide a test result;
determine, based on the test result, a portion of the unprogrammed memory cells for which a threshold voltage is above a predetermined voltage;
determine that the portion of the unprogrammed memory cells exceeds a predetermined limit; and
in response to determining that the portion exceeds the predetermined limit, copy data from the first memory block to a second memory block,
wherein the predetermined limit is determined based on evaluating an environmental characteristic of a memory device that contains the first and the second memory block, wherein the environmental characteristic is detected by a sensor disposed in the memory device.

19. The non-transitory computer-readable medium of claim 18, wherein the instructions further cause the at least one processing device to receive sensor data reflecting the at least one operating characteristic.

20. A method comprising:
performing a test read on unprogrammed memory cells in a first memory block to provide a test result;
determining, based on the test result, a portion of the unprogrammed memory cells for which a threshold voltage is above a predetermined voltage;
determining that the portion of the unprogrammed memory cells exceeds a predetermined limit;
in response to determining that the portion exceeds the predetermined limit, moving data from the first memory block to a second memory block and storing an indication that the first memory block is to be erased prior to being programmed;
erasing the first memory block;
after erasing the first memory block, writing data to the first memory block;
reading the written data using a plurality of reads to the first memory block; and
counting a number of the reads to the first memory block,
wherein the test read is performed in response to the number of reads exceeding a predetermined limit.

21. A method comprising:
determining at least one operating characteristic for a memory device that includes the first memory block;
evaluating the at least one operating characteristic to provide an evaluation result that indicates an extent of read disturb for the first memory block;
determining that the evaluation result exceeds a predetermined threshold, wherein determining that the evaluation result exceeds the predetermined threshold comprises detecting an anomaly that deviates, by the predetermined threshold, from historical data patterns associated with operation of the memory device;

performing a test read on unprogrammed memory cells in a first memory block to provide a test result, wherein the test read is performed in response to determining that the evaluation result exceeds the predetermined threshold;

determining, based on the test result, a portion of the unprogrammed memory cells for which a threshold voltage is above a predetermined voltage;

determining that the portion of the unprogrammed memory cells exceeds a predetermined limit; and in response to determining that the portion exceeds the predetermined limit, moving data from the first memory block to a second memory block and storing an indication that the first memory block is to be erased prior to being programmed.

\* \* \* \* \*